United States Patent

[11] 3,585,527

[72] Inventor Jakob Luscher
Carouge Geneva, Switzerland
[21] Appl. No. 869,474
[22] Filed Oct. 27, 1969
[45] Patented June 15, 1971
[73] Assignee Societe Suisse Pour L'Industrie Horlogere S. A.
Geneva, Switzerland

[54] OSCILLATOR CIRCUIT INCLUDING A QUARTZ CRYSTAL OPERATING IN PARALLEL RESONANCE
4 Claims, 5 Drawing Figs.

[52] U.S. Cl. .................... 331/116R, 58/23 A, 58/23 AC, 331/109, 331/186
[51] Int. Cl. .................... H03b 5/36
[50] Field of Search .................... 58/23; 331/116, 111, 109, 186

[56] References Cited
UNITED STATES PATENTS
3,213,390 10/1965 Faith et al. .................... 331/109
OTHER REFERENCES
McPhail, EEE, Pg. 88, Mar. 1969 331-116

*Primary Examiner*—John Kominski
*Attorney*—Waters, Roditi, Schwartz and Nissen

ABSTRACT: An oscillator circuit which comprises a quartz crystal operating in parallel resonance, a MOS transistor, forming the active component of the circuit, and means for setting the amplitude of the periodic signal delivered by the circuit. These means include another MOS transistor, in series with the first, and a voltage source, e.g. an amplifier, for controlling the second transistor, said source delivering a continuous signal having a value sufficient to place the second transistor in current saturation conditions. Both transistors are preferably of the "enhancement" type. Such a circuit, although it would be supplied by a low voltage source, would only consume a very small amount of power.

OSCILLATOR CIRCUIT INCLUDING A QUARTZ CRYSTAL OPERATING IN PARALLEL RESONANCE

An object of the present invention is to provide a quartz oscillator circuit which is capable of being made in miniature form, in particular in at least partly integrated form, and which is capable of producing, with very small power consumption, a periodic signal of particularly stable frequency.

The importance of these two requirements is highlighted when such an oscillator circuit forms the time-base for an electronically operating time-piece, in particular a wristwatch, which further comprises, in known manner, a series of stages for dividing the signal produced by the oscillator circuit, and an electromechanical converter which is fed with the signal that has been divided by these stages and which serves to drive the wheels of the watch.

It is known that quartz crystals oscillating in the thickness shear mode age little, not very sensitive to shocks and can be so cut that their temperature coefficient remains constant within a fairly extensive temperature range and compensates that due to the oscillator circuit as such. This kind of quartz crystal is thus particularly suitable for use in a wristwatch. It should however be pointed out that the power consumption of an oscillator that includes such a quartz crystal is only small if this quartz crystal is made to function in parallel resonance in the circuit. Further, if the oscillator is required to have a power consumption not exceeding a few $\mu$W while supplying an alternating voltage of about 1V, the capacitance provided by the oscillator circuit for the quartz crystal must be very small, i.e. of the order of the static capacitance of the quartz crystal itself.

In the well-known so-called "three-point" oscillator circuits, only one transistor is needed, by way of active element for the circuit, to keep the oscillation going. However, in these circuits, the transistor has to be connected by at least two of its electrodes to points of the circuit at which there are large impedances for the oscillation frequency. This becomes particularly bothersome when the oscillator is required to consume only very little power since the current required for the transistor must flow through at least one of these impedances if the transistor may satisfy the oscillation conditions. This large impedance can be that of a coil, of a tuned circuit or of a resistor having a very large resistance.

Because of the small amount of space that is available in a wristwatch, the use of a coil or of a tuned circuit would not be very appropriate and would moreover be uneconomic.

The use of a high resistance resistor would involve a high supply voltage if sufficient current is to be made available to the transistor and such a current would obviously give rise to a fairly large power loss in the resistor.

If, however, a resistor having a lesser resistance is resorted to, the power that is dissipated because of the alternating output voltage of the oscillator becomes relatively high.

The cells at present available which are capable of being put into a wristwatch casing and which are therefore of relatively small size are only able to supply very little power and at a low voltage, thereby obviously excluding the use of a high resistance resistor. The use of a low resistance resistor would mean that a very large part of the power available in the cell would be consumed in the oscillator, whereas this power should almost entirely serve to supply the frequency divider and the time-indicating means of the wristwatch.

It should moreover be noted that is necessary for the amplitude of the signal that is delivered by an oscillator circuit of the kind described (which amplitude has a value which is set by the electronic circuits that are to be controlled by the oscillator, e.g. dividing circuits) may be regulated by extremely simple means.

The oscillator circuit provided by the invention comprises a quartz crystal operating in parallel resonance, an insulated-gate field-effect transistor (MOS), forming the active component of the circuit, and means for setting the amplitude of the periodic signal delivered by the circuit, said means including a second insulated-gate field-effect transistor, in series with said first transistor, and a voltage source for controlling the second transistor, said source delivering a continuous signal having a value which is at least sufficient to place the second transistor in current saturation conditions. Such a circuit, although it would be supplied by a low voltage source, would only consume a very small amount of power.

The transistors comprised by this circuit are preferably of the "enhancement" type wherein the current throughflow is known to be extremely small when the control voltage is nil, thus making it possible to produce an oscillator circuit of even lower power consumption.

Another object of the invention is to achieve stabilization of the periodic signal delivered by the oscillator circuit thereby to stabilize the frequency of this signal.

To this end, the control voltage source consists of an amplifier which is controlled by a signal derived from the output signal of the oscillator circuit and which is connected, by its output, to the gate of the second transistor.

Figure 1:
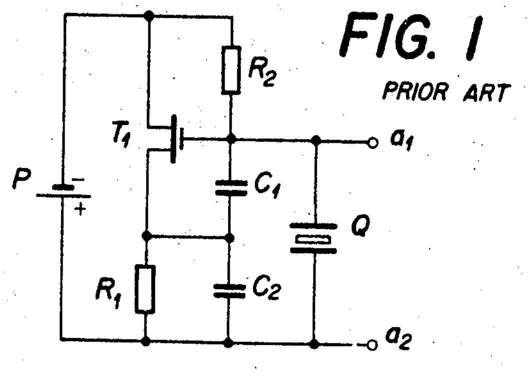
FIG. 1 PRIOR ART
FIG. 1 is a diagram of a parallel-resonance quartz oscillator circuit of known kind.

The oscillator circuit illustrated in FIG. 1 comprises an insulated-gate field-effect transistor $T_1$, a resistor $R_1$ in series with transistor $T_1$ and with a continuous voltage source $P$, a voltage divider which is made up of two capacitors $C_1$ and $C_2$ and which is connected between the gate of transistor $T_1$ and the positive terminal of source P, the connecting point of capacitors $C_1$ and $C_2$ being connected to the point of connection between resistor $R_1$ and transistor $T_1$, a quartz crystal Q having its two electrodes connected to the two ends of the divider $C_1$, $C_2$, and a resistor $R_2$ for setting the control voltage of the transistor $T_1$.

Resistor $R_1$ helps to set the amplitude of the periodic signal delivered by the oscillator at terminals $a_1$ and $a_2$ which are respectively connected to the opposite electrodes of quartz crystal Q.

It has been shown (see for instance Heising "Quartz crystals for electrical circuits" D. Van Norstrand) that the power which is dissipated in a quartz crystal is equal to $V^2/2R_p$, in which relationship $V$ stands for the amplitude of the alternating voltage that is applied to the quartz crystal and $R_p$ the equivalent parallel resistance of the quartz crystal.

This resistance $R_p$ is given by the relationship $$R_p=1/\omega^2(C_o+C_T)^2R_e$$

wherein $\omega$ = the angular frequency;

$C_o$ = the static capacitance of the quartz crystal;

$C_T$ = the total capacitance of the circuit for the quartz crystal; and $R_e$ = the equivalent series resistance of the quartz crystal. 1]

For a quartz crystal oscillating at a frequency of a few MHz, the capacitance $C_o$ is, for instance, of the order of 1 to 2 pF whereas the capacitance $C_T$ of a conventional circuit ranges from 10 to 30 pF. Because the value of this capacitance $C_T$ is relatively large, it follows that the equivalent parallel resistance of the quartz crystal is low and this means that a rather large dissipation of power takes place in the quartz crystal.

This power is in fact greater than $V^2/2R_p$ because, besides the parallel resistance $R_p$, there should be added in parallel firstly an equivalent resistance $R'$ due to resistor $R_1$ such that $$R'=R_1[1+C_2/C_1]^2$$

and secondly the resistor $R_2$ so that the total dissipated power is equal to:

$$P=V^2/2R_p+V^2/2R'+aV^2/2R_2$$

Resistor $R_2$ can have a very large resistance or ohmic value so that the term $V^2/2RAw2$ can be neglected.

For this power $P$ to be particularly low, the oscillator circuit should therefore have both a very low capacitance $C_T$ and a very high ohmic resistance $R'$.

This could only be achieved by resorting to a high supply voltage in view of the amount of current required by transistor $T_1$ for the oscillator circuit to operate properly a priori, this would exclude the use of such an oscillator circuit in all cases where the supply is provided by a small cell, as for instance when an oscillator circuit of the illustrated kind is required to act as the time-base of an electronic timepiece of small size, e.g. an electronic wristwatch.

Figure 2:
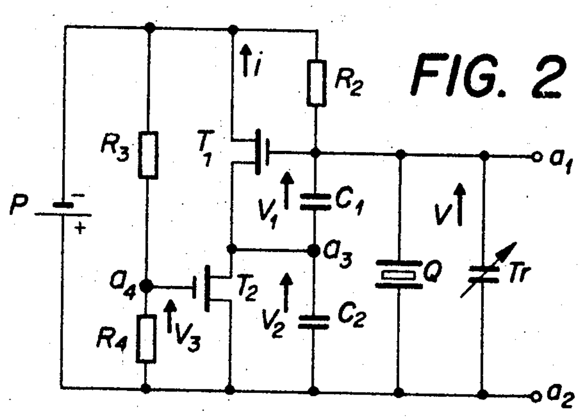
FIG. 2 is a diagram of a parallel-resonance quartz oscillator circuit embodying the invention.

With the oscillator circuit of FIG. 2, which is structurally very simple, this drawback can be overcome. This oscillator circuit can moreover readily be made in integrated form, except for the quartz crystal, the trimmer $Tr$ and possibly the resistors $R_3$ and $R_4$, so that the capacitance of the circuit can be kept at a particularly low value.

In this circuit, the resistor $R_1$ that is visible in FIG. 1 is replaced, in its function, by the output resistance of a second insulated-gate field-effect transistor $T_2$, there being applied to the gate a sufficiently high control voltage to keep the transistor saturated by the current flowing therethrough. This voltage is taken from the point of connection between the two resistors $R_3$ and $R_4$ that are series mounted with the source and which act as a voltage divider. Adjustment of the frequency of this oscillator circuit is performed by the trimmer $Tr$.

Figure 3:
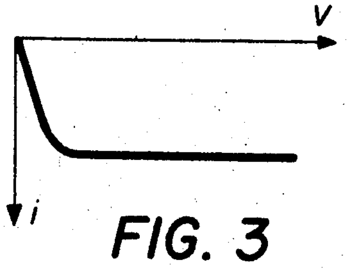

FIG. 3 illustrates the way in which the current flowing through an insulated-gate field-effect transistor varies with changes in the supply voltage and with a set control voltage being applied to the gate.

Under saturation conditions, the output, so-called saturating, resistance is equal to $\delta V/\delta i$; it becomes very large with small currents.

If the electronic components of the illustrated oscillator circuit are made in integrated form and if, as a result, the capacitance of the circuit is low, the current flowing through transistor $T_2$ is very small and consequently the saturating resistance is very high. This is of particular advantage since, as a result, the value of the previously mentioned resistance $R'$ is also very high so that the power being dissipated in the oscillator circuit of FIG. 2 is very low.

By way of example, the supply current of an oscillator circuit, such as that shown in FIG. 2, intended to act as a time-base for an electronic watch, is of the order of 1 $\mu$A. For such a low current the saturating resistance of a field-effect transistor can reach a value of 100 M$\Omega$ or more, so that its effect in assessing the power dissipated by the quartz crystal Q can be neglected.

It can moreover be shown that, in an oscillator circuit of this kind, the amplitude of the alternating voltage across the quartz crystal is directly proportional to the current flowing through transistors $T_1$ and $T_2$, so that it becomes possible to adjust the alternating voltage across the quartz crystal by suitably regulating the current flowing through transistor $T_2$.

In FIG. 2, $V_1$, $V_2$ and $V$ are the amplitudes of alternating voltages respectively appearing between points $a_3$ and $a_1$, $a_2$ and $a_3$, and $a_2$ and $a_1$ of the circuit, $V_3$ is the continuous voltage controlling transistor $T_2$, and $i$ is the continuous current flowing through transistors $T_1$ and $T_2$.

As is known, the saturating current, $i_s$, and the control voltage, $V_e$, of an insulated-gate field-effect transistor are tied by the relationship $$i_s = K(V_e - V_{e_0})^2$$

wherein $K$ is the slope of the transistor at $A/V^2$ and $v_{e_0}$ is its threshold voltage.

Figure 4:
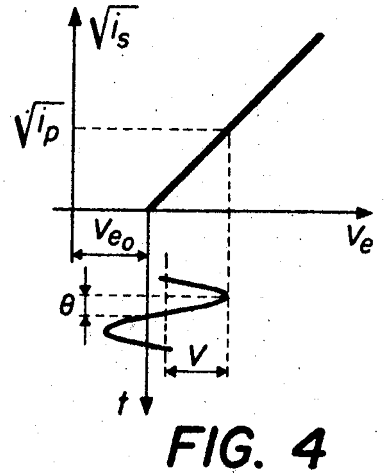
FIGS. 3 and 4 are explanatory graphs.

This relationship is usually represented as shown in FIG. 4 which shows the variation of $\sqrt{i_s}$ as a function of $V_e$.

If the control voltage $V_e$ has a sinusoidal outline, as is for instance the case with transistor $T_1$, the current flowing through this transistor is obviously a periodic current having a peak value, $i_p$, which corresponds to the maximum value of this voltage $V_e$ (FIG. 4).

The curve of this periodic current can be expressed in terms of Fourier components, so that the following expressions can be written for transistor $T_1$:

(a) $i_\omega = i_p f(\Theta)$ wherein $i_\omega$ = the amplitude of the basic component of the current;

$i_p$ = the peak value; and $\Theta$ = the value of the angle separating the instant when the saturating current is at a maximum and that when this current has becomes nil again.

(b) $i = i_p \Psi(\Theta)$ wherein $i$ = the continuous component of the current, values $f(\Theta)$ and $\Psi(\Theta)$ being derived from a Fourier breakdown of the current curve, as described.

There may further be written:

(c) $V_2 = i_\omega R_a$ wherein $R_a$ is the apparent resistance between points $a_3$ and $a_2$ $$R_a = \left[\frac{C_1}{C_1 + C_2}\right]^2 \frac{R_D \cdot R_2}{(R_D + R_2)}$$

i.e., after combining relationships (a) and (c):

(d) $V_2 = i_p f(\Theta) \cdot R$ and, by combining (b) and (d):

(e) $$V_2 = \underline{i} \cdot R_a \cdot \frac{f(\theta)}{\psi(\theta)}$$

If the capacitance of capacitors $C_1$ and $C_2$ is for instance such that $C_1 = C_2$, it follows that $V_1 = V_2$ and the amplitude of voltage $V$ is equal to (f) $$V = 2V_2 = 2 \cdot \underline{i} \cdot \frac{f(\theta)}{\psi(\theta)} \cdot R_a$$

i.e.:

(g) $$V = \underline{i} \cdot \frac{1}{2} \cdot \frac{f(\theta)}{\psi(\theta)} \cdot \frac{R_D \cdot R_2}{(R_D + R_2)}$$

As a general rule, $\Theta$ can lie between 0° and 180° so that $f(\Theta)$/<~'($\Theta$) will have a value lying between 2 and 1.33.

When the described oscillator circuit is operating under normal working conditions, $\Theta$ is equal to 90° and $f(\Theta)/\Psi(\Theta) = 1.7$ so that the amplitude of the alternating voltage across the quartz crystal becomes (h) $$V = \underline{i} \cdot 0.85 \cdot \frac{R_D \cdot R_2}{(R_D + R_2)}$$

This amplitude is thus indeed proportional to the current flowing through transistors $T_1$ and $T_2$, which current can be set by acting on the control voltage $V_3$ of transistor $T_2$ since this current is governed by the previously indicated relationship $$i = K_2(V_3 - V_{e_0})^2$$

wherein $V_{e_0}$ = the threshold voltage of transistor $T_2$; and $K_2$ = the slope of transistor $T_2$.

In the case of the oscillator circuit shown in FIG. 2, the amplitude of the periodic signal produced by this circuit is set once and for all by means of the voltage divider made up of resistors $R_3$ and $R_4$, the value of the control voltage of transistor $T_2$ being dependent on this setting.

With the modified constructional form represented in FIG. 5, the amplitude of the periodic signal at the quartz crystal terminals can be stabilized in a practically perfect manner by suitably regulating the control voltage of transistor $T_2$ as will now be described. Stabilization of the amplitude of the signal is highly desirable, particularly when the circuit is to be in integrated form, since the input capacitance of this kind of transistor as well as the capacitances of the junctions of the various components are dependent on the voltage being applied, as is well known.

According to the invention, this regulating action is achieved by means of an amplifier controlled by a signal which is derived from the output signal of the oscillator circuit and which acts on transistor $T_2$ in such a way that for any increase in amplitude of this output signal there occurs a proportional decrease of the current flowing through this transistor, and vice versa. With such a feedback, particularly good amplitude stabilization of the signal produced by the oscillator circuit can easily be achieved.

Since the control voltage for transistor $T_2$ must be continuous, the alternating voltage which is taken from the output of the oscillator and which controls the amplifier, or the output voltage of this amplifier, must therefore be rectified.

Figure 5:
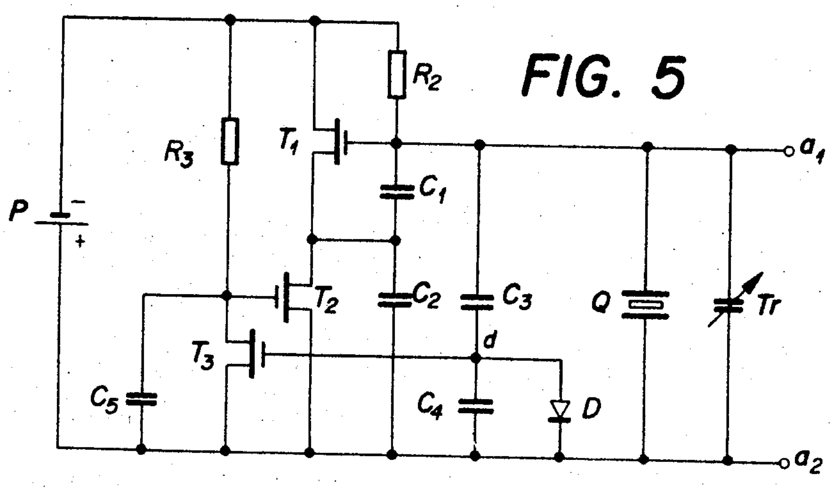
FIG. 5 is a diagram of a variant of the circuit shown in FIG. 2.

In the modified constructional form shown in FIG. 5, it is the second of these possibilities that has been resorted to.

This amplifier is made up of an insulated-gate field-effect transistor $T_3$ and of a resistor $R_3$ which are series connected with source $P$ and which are controlled by a capacitive voltage divider comprising capacitors $C_3$ and $C_4$, the latter being series mounted between the output terminals $a_1$ and $a_2$ of the oscillator circuit. A clamping diode D determines the continuous potential at point $d$. If the peak-to-peak voltage at this point reaches a value corresponding to that of the threshold voltage of transistor $T_3$, the resulting current in this transistor causes a voltage drop across resistor $R_3$; consequently the control voltage of transistor $T_2$ acquires a well determined value. This voltage will be so much the lower, respectively so much the higher, if the control voltage of transistor $T_3$ is high, respectively low, i.e. if the amplitude of the alternating signal delivered by the oscillator circuit is large, respectively small. In this way, the current flowing through transistors $T_1$ and $T_2$ can be adjusted to a value which will bring about the voltage required across the quartz crystal Q, this value thus being well determined by the ratio between the capacitances of capacitors $C_3$ and $C_4$ of the voltage divider to which is connected the gate of transistor $T_3$, and by the threshold value of this transistor.

Rectification of the voltage needed for the control of transistor $T_2$ is performed in the present instance by transistor $T_3$, a capacitor $C_5$ being provided to cancel out the alternating components of the output voltage from the amplifier formed by this transistor and by resistor $R_3$.

All of the elements referenced $T_1$, $T_2$, $T_3$, $C_1$, $C_2$, $C_3$, $C_4$, $C_5$ and D can readily be produced in integrated form.

Of course, the amplifier formed by transistor $T_3$ and resistor $R_3$ could, by way of alternative, be differently constituted without departing from the scope of the invention.

The described oscillator circuit is meant to be supplied by a mercury oxide or silver oxide cell $P$ which, as is known, is capable of supplying a voltage which is highly stable. Since moreover, the amplitude of the signal produced by this oscillator circuit is particularly well stabilized in the manner described, it follows that the quartz oscillator circuit according to the invention is highly stable as regards the frequency of the signal that is produced and yet consumes very little power.

The transistors that are used in the described circuits are of the $P$ type. It will of course be appreciated that these same circuits could be produced with N-type transistors; this would simply mean reversing the polarities of the supply source of each circuit.

Although, in the preceding description, the oscillator circuit has been described in relation with the time measuring art, clearly such a circuit can equally well be used in other fields, in particular in all cases where constancy in amplitude and in frequency of the signal being produced would be a particularly important requirement, and where power consumption needs to be very low.

I claim:

1. An oscillator circuit comprising a quartz crystal operating in parallel resonance, a first insulated-gate field-effect transistor, forming the active component of the circuit, a second insulated-gate field-effect transistor, in series with said first transistor, and a voltage source connected to the gate of said second transistor and delivering a continuous signal having a value sufficient to place said second transistor in current saturation conditions.

2. An oscillator circuit according to claim 1, wherein said transistors are of the so-called "enhancement" type.

3. An oscillator circuit according to claim 1, wherein said control voltage source includes an amplifier which is controlled by a signal derived from the output signal of the oscillator circuit and which is connected by its output to the gate of said second transistor.

4. An oscillator circuit according to claim 3, wherein said amplifier comprises a resistor and a third insulated-gate field-effect transistor which are series connected with a continuous voltage supply source, the gate of said third transistor being connected to the point of connection between two capacitors forming a divider of the periodic voltage delivered by the oscillator, the point of connection of said resistor with said third transistor being connected to the gate of said second transistor.